United States Patent [19]

Reichert

[11] 4,266,333
[45] May 12, 1981

[54] METHOD OF MAKING A SCHOTTKY BARRIER FIELD EFFECT TRANSISTOR

[75] Inventor: Walter F. Reichert, East Brunswick, N.J.

[73] Assignee: RCA Corporation, New York, N.Y.

[21] Appl. No.: 33,827

[22] Filed: Apr. 27, 1979

[51] Int. Cl.³ .................................. H01L 21/28
[52] U.S. Cl. ........................... 29/571; 29/578; 29/579; 29/589; 29/591
[58] Field of Search ............ 29/578, 579, 589, 591, 29/571

[56] References Cited

U.S. PATENT DOCUMENTS

| | | | |
|---|---|---|---|
| 3,866,310 | 2/1975 | Driver | 29/571 |
| 3,961,414 | 6/1976 | Humphreys | 29/591 |
| 4,075,651 | 2/1978 | James | 357/22 |
| 4,104,672 | 8/1978 | DiLorenzo et al. | 357/22 |
| 4,107,720 | 8/1978 | Pucel | 357/22 |

Primary Examiner—G. Ozaki
Attorney, Agent, or Firm—Birgit E. Morris; Donald S. Cohen

[57] ABSTRACT

A Schottky barrier field effect transistor is made by coating the surface of a body of semiconductor material with a metal layer having good ohmic contact with the semiconductor material and defining the metal layer to form spaced source and drain contacts. A relatively thick layer of an insulating material such as silicon oxide or silicon nitride, is coated over the source and drain contacts and the exposed portions of the surface of the semiconductor material between the source and drain contacts. Using a photoresist mask, an opening is etched through the insulating layer to the surface of the semiconductor material over the space between the source and drain contacts with the opening being etched back slightly from the edges of the photoresist mask. Using the photoresist mask as a deposition mask, a metal film is deposited through the opening in the insulating layer onto the exposed surface of the semiconductor material to form the gate. After removing the photomask, a metal contact is plated on the gate to substantially fill the opening in the insulating layer.

7 Claims, 6 Drawing Figures

METHOD OF MAKING A SCHOTTKY BARRIER FIELD EFFECT TRANSISTOR

BACKGROUND OF THE INVENTION

The present invention relates to a method of making a Schottky barrier field effect transistor, and particularly for making such a field effect transistor with a narrow gate using an insulating layer to passivate the transistor and to define the gate.

Schottky barrier field effect transistors generally comprise a body of a semiconductor material having on a surface thereof spaced source and drain contacts and a gate between the source and drain contacts. The source and drain contacts have ohmic contact with the semiconductor body and the gate has a Schottky barrier contact with the semiconductor body. These transistors are generally made by first coating the surface of the semiconductor body with a layer of a metal having an ohmic contact with the semiconductor material. Then, using a photoresist masking layer, the metal is defined by etching portions away to form the source and drain contacts. The photoresist layer is removed and a second photoresist layer is applied and photolithographically defined to provide openings for the gate. A metal layer is then deposited, generally by the technique of evaporation in a vacuum, over the photoresist layer and the surface of the semiconductor body exposed between gate openings in the photoresist layer. The photoresist layer is then removed which also lifts off the portions of the metal layer on the photoresist layer. This leaves the gate metal which then can be annealed to insure a Schottky barrier junction. An insulating layer is then coated over the device to passivate the source, drain and gate.

This method of making Schottky barrier field effect transistors has several disadvantages. This method requires several photoresist coatings and definitions, each of which takes time and adds to the cost of making the transistor. Also, each photoresist layer leaves behind some contamination which adversely affects the good adhesion of the passivation layer to the transistor. In addition, when the second photoresist layer is removed lifting off part of the metal layer, the portion of the metal layer so removed is torn or broken away from the remaining gate portion of the metal layer. This tearing away is not always clean so that the edges of the gate region are often torn or uneven.

SUMMARY OF THE INVENTION

A Schottky barrier field effect transistor is made by forming spaced source and drain contacts on a surface of a body of a semiconductor material and coating the source and drain contacts and the exposed portion of the surface of the semiconductor material with a relatively thick layer of an insulating material. A photoresist layer is provided on the insulating layer with the photoresist layer having an opening therethrough over the space between the source and drain contacts. An opening is formed through the insulating layer to the surface of the semiconductor body through the opening in the photoresist layer, such that the wall of the opening in the insulating layer extends back away from the edge of the opening in the photoresist layer. Separate metal layers are then simultaneously deposited on the photoresist layer and on the exposed surface of the semiconductor body through the opening in the photoresist layer. The metal layer on the semiconductor body is of a width corresponding to the width of the opening in the photoresist layer. The photoresist layer and the metal layer thereon is then removed.

DETAILED DESCRIPTION OF THE INVENTION

Figure 1:
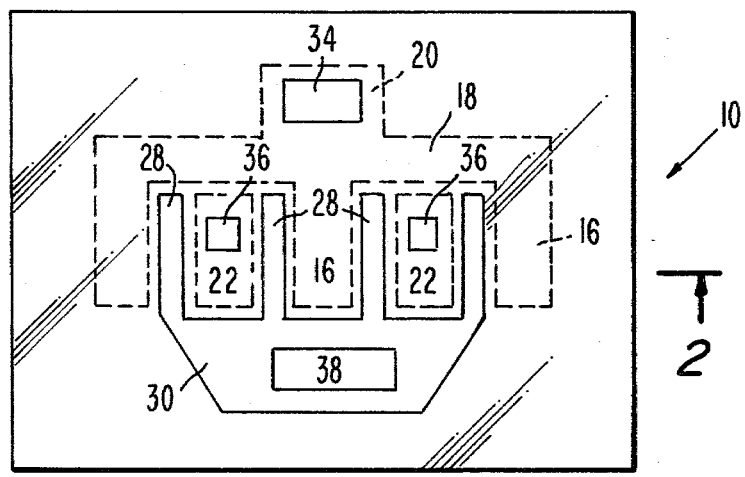
FIG. 1 is a top plan view of a form of a Schottky barrier field effect transistor made in accordance with the method of the present invention.
Figure 2:
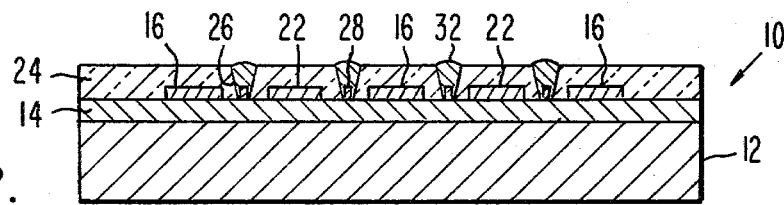
FIG. 2 is a sectional view of the Schottky barrier field effect transistor taken along line 2—2 of FIG. 1.

Referring to FIGS. 1 and 2, a form of the Schottky barrier field effect transistor made by the method of the present invention is generally designated as 10. The field effect transistor 10 comprises a substrate 12 of an insulating material, such as sapphire, spinel or insulating gallium arsenide. On a surface of the substrate 12 is a body 14 of a semiconductor material of the desired conductivity type such as single crystalline silicon or gallium arsenide. The semiconductor body 14 is preferably a layer of the semiconductor material which is epitaxially deposited on the substrate 12.

On the surface of the semiconductor body 14 are a plurality of metal drain contacts 16 which are spaced apart and extend from a common bus connection 18. A terminal pad 20 extends from the bus connection 18 in the direction opposite the drain contacts 16. Between adjacent drain contacts 16 are metal source contacts 22, each of which is spaced from the adjacent drain contacts 16. Drain and source contacts 16 and 22 are of a metal which forms a good ohmic contact with the semiconductor body 14. For gallium arsenide the metal may be gold or alloys of gold, or nickel. For silicon the metal may be aluminum, nickel or titanium. A relatively thick layer 24 of an insulating material, such as silicon oxide or silicon nitride, is over the drain and source contacts 16 and 22 and the portions of the surface of the semiconductor body 14 between the source and drain contacts. The insulating layer 24 has openings 26 therethrough along lines between adjacent source and drain contacts. The openings 26 extend to the surface of the semiconductor body 14.

A gate 28 is on the portion of the surface of the semiconductor body 14 at the bottom of each of the openings 26. As shown in FIG. 1, the gates 28 are connected together by a bus connector 30. The gates 28 are of a metal which forms a Schottky barrier junction with the semiconductor body 14, such as aluminum, nickel, or a refractory metal or a noble metal. A gate contact 32 such as gold, is on each of the gates 28 and fills the respective opening 26 in the insulating layer 24. The thick gate contact 32 lowers the resistance of the gate. If desired, terminal posts 34, 36 and 38 may be provided on the drain terminal pad 20, source contacts 22, and gate bus connector 30, respectively. The terminal posts 34 and 36 are formed through openings in the insulating layer 24. The terminal post 38 is formed directly on the gate bus connector 30 which is exposed.

Figure 3:
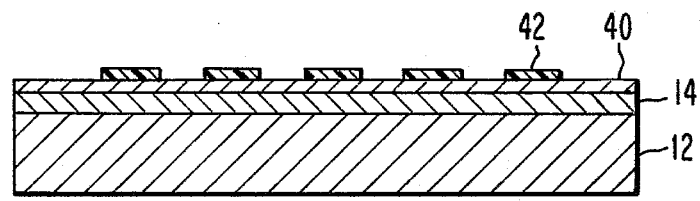
FIGS. 3 through 6 are sectional views illustrating the various steps of the method of the present invention for making the Schottky barrier field effect transistor shown in FIGS. 1 and 2.

To make the field effect transistor 10 by the method of the present invention, one starts with a substrate 12 having the body 14 of the semiconductor material thereon. As shown in FIG. 3, a layer 40 of the metal which will form the source and drain contacts is coated over the entire surface of the semiconductor body 14, such as by the well known technique of evaporation in a vacuum. A layer 42 of a photoresist is coated over the metal layer 40 and is photolithographically defined so that it covers the areas of the metal layer 40 which are to form the drain contact 16, bus connector 18, terminal pad 20, and source contacts 22. The exposed portions of the metal film 40 are then removed with a suitable etchant and the resist layer 42 is then removed with a suitable solvent.

Figure 4:
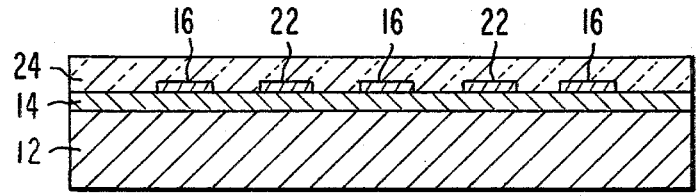

As shown in FIG. 4, the insulating layer 24 is then coated over the exposed surface portions of the semiconductor body 14, the drain contact 16, bus connector 18, terminal pad 20 and source contacts 22. The insulating layer 24 may be deposited by the well known technique of deposition from a vapor. For example, a layer of silicon oxide can be deposited by heating a mixture of silane and either oxygen or water vapor, and a layer of silicon nitride can be deposited by heating a mixture of a silane and ammonia.

Figure 5:
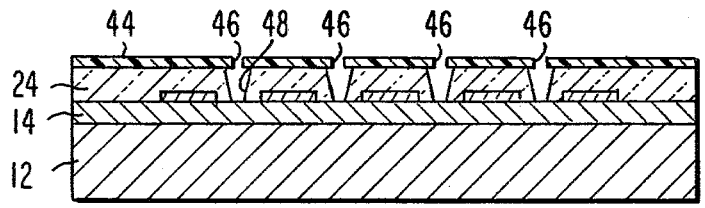
Figure 6:
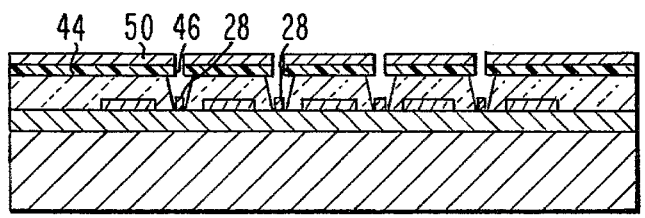

As shown in FIG. 5, a photoresist layer 44 is then coated over the insulating layer 24 and is photolithographically defined to provide openings 46 therethrough. The openings 46 are arranged over the portions of the surface of the semiconductor body 14 between adjacent drain and source contacts 16 and 22, and over the portion of the surface of the semiconductor body 14 where the gate bus connector 30 is to be formed. At the areas of the surface of the insulating layer 24 exposed through the opening 46 in the photoresist layer 44, openings 48 are formed through the insulating layer 24 to the surface of the semiconductor body 14. The openings 48 are formed by means of an etchant which not only etches through the particular material of the insulating layer 24 but etches the sides of the opening 48 so that they taper back away from the edges of the openings 46 in the photoresist layer 44. If the insulating layer 24 is of silicon oxide, a suitable method and etchant for etching the openings 48 is described in U.S. Pat. No. 3,839,111 to E. J. Ham et al entitled "METHOD OF ETCHING SILICON OXIDE TO PRODUCE A TAPERED EDGE THEREON", issued Oct. 1, 1974. If the insulating layer is silicon nitride, the openings 48 can be etched by the well known technique of plasma etching in a gas mixture which contains $CF_4$.

The metal for the gates 28 and gate bus connector 30 is then deposited by the well known technique of evaporation in a vacuum through the openings 46 in the photoresist layer 44 and the openings 48 in the insulating layer 24. The metal is deposited on the exposed surface of the semiconductor body 14 at the bottom of the grooves 48 to form the gates 28 and the bus connector 30. During this deposition the photoresist layer 44 serves as a mask so that the size of the gates 28 is defined by the size of the openings 46 in the photoresist layer 44. During the deposition of the gates 28, the metal also deposits on the photoresist layer 44 to form a metal layer 50. However, since the walls of the openings 48 are tapered back away from the edges of the openings 46, the metal layer 50 on the photoresist layer 44 does not extend into the openings 48 and is therefore not connected to the gates 28. The photoresist layer 44 is then removed with a suitable solvent, and this also lifts off the metal layer 50. Since the metal layer 50 is not connected to the gates 28, the metal layer 50 is easily removed without adversely affecting the gates 28. The openings 48 are then filled with the gate contacts 32, such as by electroplating the metal of the gate contacts 32 onto the gates 28.

In the method of the present invention the insulating layer 24 serves as the passivation for the field effect transistor 10 and as a portion of the mask for forming the gate 28. By having the insulating layer 24 applied to the drain and source contacts 16 and 22 early in the making of the field effect transistor 10, the drain and source contacts 16 and 22 are protected during the remaining processing of the transistor. For example, they are protected during further heating steps which could adversely affect the adhesion of the contacts to the semiconductor body and are protected from being shorted out during subsequent deposition and plating steps. Also there is only one photoresist step prior to applying the insulating layer 24 so that contamination of the surfaces of the semiconductor body 14 and the drain and source contacts 16 and 22, which can adversely affect the adhesion of the insulating layer to the device, is minimized. By using the relatively thick insulating layer as part of the mask for depositing the gate 28, the gate can be made thick, thus lowering its resistance, while maintaining the desired short length of the gate. Also, as previously stated, the thick insulating layer allows for ease of lift-off of the photoresist and overlying metal layer without damaging the gate 28.

I claim:

1. A method of making a Schottky barrier field effect transistor comprising the steps of:
   (a) forming spaced source and drain contacts on a surface of a body of a semiconductor material,
   (b) coating the source and drain contacts and the exposed portions of said surface of the semiconductor body with a relatively thick layer of an insulating material,
   (c) providing on said insulating layer a layer of photoresist having an opening therethrough over the space between the source and drain contacts,
   (d) forming through the opening in the photoresist layer an opening through the coating layer to the surface of the semiconductor body such that the walls of the opening in the insulating layer extend back away from the edge of the opening in the photoresist layer,
   (e) simultaneously depositing separate metal layers on the photoresist layer and on the surface of the semiconductor body through the opening in the photoresist layer with the metal layer on the semiconductor body being of a width corresponding to the width of the opening in the photoresist layer,
   (f) removing the photoresist layer and the metal layer thereon, and
   (g) leaving the insulating layer on the source and drain contacts and the semiconductor body.

2. The method in accordance with claim 1 wherein the opening in the insulating layer is formed by an etching technique which causes the side walls of the opening to taper back away from the edges of the opening in the photoresist layer.

3. The method in accordance with claim 1 wherein step (e) is carried out by the deposition technique of evaporation in a vacuum with the opening in the photoresist layer serving as a mask to control the width of the metal layer deposited on the surface of the semiconductor body at the bottom of the opening in the insulating layer.

4. The method in accordance with claim 3 in which the metal layer deposited on the surface of the semiconductor body at the bottom of the opening in the insulating layer is of a thickness such that it does not fill the opening and is spaced from the metal layer deposited on the photoresist layer.

5. The method in accordance with claim 4 in which after the photoresist layer with the metal layer thereon is removed, the opening in the insulating layer is filled with a metal which contacts the metal layer at the bottom of the opening.

6. The method in accordance with claim 5 in which the opening is filled with the metal by plating the metal onto the metal layer in the bottom of the opening.

7. The method in accordance with claim 1 in which the source and drain contacts are formed by coating the surface of the semiconductor body with a metal layer, providing a photoresist layer on the areas of the metal layer which are to form the source and drain contacts, removing the portions of the metal layer not covered by the photoresist, and then removing the photoresist.

* * * * *